(12) United States Patent
Oelmann (10) Patent No.: US 10,847,284 B2
(45) Date of Patent: Nov. 24, 2020

(54) SENSOR LINE

(71) Applicant: LEONI Kabel GmbH, Nuremberg (DE)

(72) Inventor: Rico Oelmann, Nuremberg (DE)

(73) Assignee: Leoni Kabel GmbH, Roth (DE)

( * ) Notice: Subject to any disclaimer, the term of this patent is extended or adjusted under 35 U.S.C. 154(b) by 282 days.

(21) Appl. No.: 16/037,149

(22) Filed: Jul. 17, 2018

(65) Prior Publication Data

US 2019/0027275 A1   Jan. 24, 2019

(30) Foreign Application Priority Data

Jul. 20, 2017  (DE) .................. 10 2017 212 460

(51) Int. Cl.
   *G01B 7/16*         (2006.01)
   *G01D 5/241*        (2006.01)
   (Continued)

(52) U.S. Cl.
   CPC ............... *H01B 7/324* (2013.01); *G01B 7/22* (2013.01); *G01D 5/241* (2013.01); *G01K 7/343* (2013.01); *H01B 7/18* (2013.01); *G01D 3/028* (2013.01); *G01R 27/2605* (2013.01); *H01B 7/0054* (2013.01)

(58) Field of Classification Search
   CPC ........ H01B 7/324; H01B 7/18; H01B 7/0054; G01B 7/22; G01D 5/241; G01D 3/028; G01K 7/343; G01R 27/2605
   See application file for complete search history.

(56) References Cited

U.S. PATENT DOCUMENTS 3,565,195 A   2/1971  Miller et al.
4,029,889 A   6/1977  Mizuochi
(Continued)

FOREIGN PATENT DOCUMENTS

DE   102009055426   7/2011
DE   102013227051   6/2015

OTHER PUBLICATIONS

Ferroelectric polymers, available at http://en.wikipedia.org/wiki/Ferroelectric_polymers on Mar. 6, 2017 (Year: 2017).*
PVDF Material Information, available at http://www.goodfellow.com/E/Polyvinylidenefluoride.html on Jun. 21, 2020 (Year: 2020).*
R. Tang and Y. Huang, "Cable insulation detection based on coplanar capacitive sensor," May 2017 32nd Youth Academic Annual Conference of Chinese Association of Automation (YAC), Hefei, 2017, pp. 286-291 (Year: 2017).*
(Continued)

*Primary Examiner* — Daniel R Miller
(74) *Attorney, Agent, or Firm* — Williams Mullen; Thomas F. Bergert (57) ABSTRACT

A sensor line for detecting an external influence on a cable is described. The sensor line comprises: a capacitor, a first dielectric, which has a first compressibility and a first permittivity, and a second dielectric, which has a second compressibility and a second permittivity. The first compressibility is smaller than the second compressibility. The first permittivity differs from the second permittivity. The sensor line is configured so that at least the second dielectric is compressible or extensible in the event of a movement of the sensor line, so that a total permittivity, which is composed of the first permittivity and the second permittivity, is variable in the movement of the sensor line. Due to the change in total permittivity, a change in the capacitance of the capacitor can be produced, which is detectable, in order to detect the external influence on the cable.

15 Claims, 6 Drawing Sheets

(51) Int. Cl.
*G01K 7/34* (2006.01)
*H01B 7/18* (2006.01)
*G01D 3/028* (2006.01)
*G01R 27/26* (2006.01)
*H01B 7/32* (2006.01)
*H01B 7/00* (2006.01)

(56) References Cited

U.S. PATENT DOCUMENTS

| | | | |
|---|---|---|---|
| 7,293,467 B2 | 11/2007 | Shank et al. | |
| 2009/0099420 A1* | 4/2009 | Woodley | A61B 1/0053 600/142 |
| 2012/0062245 A1* | 3/2012 | Bao | G06F 3/044 324/661 |
| 2016/0033343 A1* | 2/2016 | Park | G01L 1/146 73/862.046 |

OTHER PUBLICATIONS

M. I. A. Mokti, I. A. Rahim, A. A. Manaf, O. B. Sidek and M. A. B. Miskam, "Design and simulation of a MEMS capacitive bending strain sensor using dielectric materials for spinal fusion monitoring," 2011 IEEE Regional Symposium on Micro and Nano Electronics, Kota Kinabalu, 2011 (Year: 2011).*

T. H. N. Dinh, P. Joubert, E. Martincic and E. Dufour-Gergam, "Flexible 3-axes capacitive pressure sensor array for medical applications," Sensors, 2014 IEEE, Valencia, 2014, pp. 855-858 (Year: 2014).*

P. D. Block and S. Bergbreiter, "Large area all-elastomer capacitive tactile arrays," Sensors, 2013 IEEE, Baltimore, MD, 2013, pp. 1-4 (Year: 2013).*

* cited by examiner

SENSOR LINE

CROSS-REFERENCE TO RELATED APPLICATION

This application claims the priority under 35 U.S.C. 119 of German Application No. DE 10 2017 212 460.1 filed on Jul. 20, 2017, the disclosure of which is incorporated by reference herein in its entirety.

FIELD OF THE INVENTION

The invention relates to a sensor line, a line and a system for detecting an external influence on a cable as well as a method for detecting a mechanical influence or temperature influence on a cable or a medium intrusion into a cable.

BACKGROUND AND SUMMARY

Properties of electric cables can change due to external influences, such as temperature or mechanical influences, for example, which act on the cable.

Measurements of effects of external influences on the cable may thus be essential for its use.

Effects of external influences, especially temperature influences, on cables are often relatively slight in temperature ranges in which the cables are used. This can make the analysis of the effects on the cables difficult.

In view of the above, cables and sensor lines for cables require further improvements in order to be able to detect external influences on the cables more accurately or at all.

The invention is based in particular on a sensor line with flexible capacitance. Here a capacitance measurement of shape-variable dielectrics is utilised.

To this end the invention teaches a sensor line for detecting an external influence on a cable, wherein the sensor line comprises: a capacitor, a first dielectric, which has a first compressibility and a first permittivity, and a second dielectric, which has a second compressibility and a second permittivity, wherein the first compressibility is smaller than the second compressibility, wherein the first permittivity differs from the second permittivity, wherein the sensor line is configured so that at least the second dielectric is compressible or extensible in the event of a movement of the sensor line, so that a total permittivity, which is composed of the first permittivity and the second permittivity, is variable in the event of the movement of the sensor line, and wherein due to the change in the total permittivity, a change can be produced in the capacitance of the capacitor, which change is detectable (i.e. measurable), in order to detect the external influence on the cable.

The permittivities described herein concern the relative permittivities of the relevant materials.

Compressibility refers in general to the property of a material to change the volume that it takes up under the effect of pressure.

It should be noted that even dielectrics that substantially have the same basic material can be used, wherein in at least one of the dielectrics another material is integrated into the matrix of the basic material (similar to doping in a semiconductor), so that the compressibility and the permittivity differ from those of the other dielectric. The invention is thus not restricted only to sensor lines in which completely different dielectrics are used as long as the compressibilities and the permittivities of the dielectrics differ.

In one configuration the first dielectric is rigid compared with the second dielectric, wherein the permittivity of the first dielectric is higher compared with the permittivity of the second dielectric.

In the event of a movement of the sensor line, a compression or an extension at least of the second dielectric (or both dielectrics) can thus occur, for example, so that the total permittivity, which is composed of the permittivities of the dielectrics, changes. This is brought about by the different compressibilities and permittivities of the two dielectrics. The change in the total permittivity can then cause a change in the capacitance of the capacitor, which can be measured. Due to this, conclusions can be drawn, for example, about mechanical influences and/or temperature influences on the sensor line and/or medium intrusions into the interior of the sensor line.

The greater the differences are in the relative permittivities of the dielectrics, the greater is the measurable effect. In one configuration of the sensor line, therefore, the first permittivity differs from the second permittivity by a factor of at least 5, preferably of at least 10, and more preferably of at least 20. For this at least the second dielectric can comprise a gas or a gas mixture.

In another configuration the sensor line comprises a plurality of capacitors, wherein the sensor line is configured so that a direction of a bend and/or a rotation direction of a torsion of the sensor line are detectable by a comparison of changes in the capacitances of the capacitors produced due to the movement of the sensor line. The detection of the direction of a bend and/or of a rotation direction of a torsion can then be taken into account in the analysis of the properties of the cable, which are changed by an external influence on the sensor line or the cable.

In one configuration of the sensor line, the second dielectric comprises a gas or gas mixture. This can have the advantage on the one hand that the relative permittivities of the dielectrics differ by a highest possible factor, due to which, as explained above, the measurable effect of the external influence on the cable or on the sensor line is increased.

On the other hand, a configuration of the sensor line in which the second dielectric comprises a gas or gas mixture permits a medium to be able to penetrate the sensor line. In one configuration the sensor line is configured so that the total permittivity is variable due to a penetration of a medium into at least a part of a volume that is occupied by the gas or gas mixture. External influences that can affect the properties of the sensor line or the cable and in which a medium penetrates at least a part of a volume, which is occupied by the gas or gas mixture, can be included in the analysis.

In another configuration of the sensor line, at least one of the dielectrics comprises a temperature-sensitive dielectric, wherein the sensor line is further configured to detect an external temperature effect on the sensor line by means of the temperature-sensitive dielectric. The sensitivity of the measurement of the external influence on the sensor line or on the cable can thus be increased, in particular if both dielectrics comprise temperature-sensitive dielectrics. In one configuration of the sensor line, only one of the dielectrics comprises a temperature-sensitive dielectric, which can lead to a more sensitive sensor line.

In another configuration, the first dielectric and the second dielectric comprise temperature-sensitive dielectrics, wherein one of the two dielectrics has a positive temperature coefficient and the other dielectric has a negative temperature coefficient. This leads to a sensor line that reacts particularly sensitively to external temperature effects, which can be detected and analysed by means of the two temperature-sensitive dielectrics.

In another configuration, the sensor line is further configured to detect an external temperature influence on the sensor line by an area extension of an electrode of the capacitor. A change in the area can be determined via the capacitance of the capacitor, which is proportional to the area of the capacitor, due to which the temperature influence on the sensor line can be analysed.

In another configuration of the sensor line, the second dielectric is wound around the first dielectric, in particular in a spiral. This can make a relatively simple manufacture of the sensor line possible.

In one configuration the sensor line is formed as a coaxial cable, wherein capacitor electrodes form the inner conductor and outer conductor of the coaxial cable. In this case an external influence on the impedance of the coaxial cable in particular can be determined precisely by way of the capacitance measurement.

In another configuration of the sensor line, the dielectrics are fitted alternating along a longitudinal direction of the sensor line in the interior of the sensor line. This makes it possible to detect an external influence on the sensor line at different places along the longitudinal direction of the sensor line. The more frequently the dielectrics alternate along the longitudinal direction of the sensor line, the more likely it is that an external influence on the sensor line or the cable is detected. The accuracy of the sensor line is thus increased.

The invention further teaches a line, comprising: a sensor line according to one of the configurations described herein, a Bowden cable, which is fitted inside the line and is fixed in a first region on a first side of the sensor line, and a protective sheath, which is fixed in a second region on a second side (opposite the first side) of the sensor line, wherein the line is configured so that the Bowden cable is rotatable or movable inside the protective sheath due to torsion or bending of the line. Mechanical influences on the sensor line can be detected by this, wherein the Bowden cable rotates or moves inside the protective sheath due to torsion or bending. This rotation or movement can then be measured.

The invention further teaches a system for detecting an external influence on a cable, wherein the system comprises: a sensor line according to one of the configurations or a line according to one configuration as described herein; and a filter system, which is configured to deduce a type of external influence on the cable on the basis of a temporal change in the capacitance of the capacitor. A distinction can be drawn here in particular between mechanical influences and temperature influences, wherein the latter affect the sensor line more slowly over a time interval than mechanical influences.

Configurations of the sensor line described herein can be used, for example, in a jumper cable or in drag chains.

The invention further teaches a method for detecting a mechanical influence or temperature influence on a cable or a medium intrusion into a cable, wherein the method comprises: provision of a sensor line, a line or a system according to one of the configurations described herein, and measurement of a change in a capacitance of the capacitor to detect the mechanical influence or temperature influence on the cable or the medium intrusion into the cable. As described above, in the event of the movement of the cable, at least the more compressible of the dielectrics can compress, extend or twist, due to which the total permittivity, which is composed of the permittivities of the dielectrics, can change. This leads to a change in the capacitance of the capacitor, which can be measured.

In one configuration, in which the sensor line comprises a plurality of capacitors, the method further comprises: comparing changes in the capacitances of the capacitors due to a movement of the cable, and determination of a direction of a bend and/or a rotation direction of a torsion of the cable on the basis of the comparison.

It should be noted that any configurations can be combined with one another in a sensible manner or realised independently of one another.

Exemplary embodiments of the invention are described in greater detail below with reference to the drawings.

DETAILED DESCRIPTION

Configurations of the invention described herein comprise a sensor line with flexible capacitance.

The invention comprises a cable structure that makes it possible to detect external influences on the cable and thus to represent a sensor line. The sensor line comprises (at least) one capacitor and (at least) two dielectrics. The change in the capacitance of the capacitor or capacitors can be used to detect loads on the sensor line. These loads can be mechanical (bending, torsion, lengthening (elongation/compression)), a medium intrusion and/or temperature-related.

In one example the second dielectric of the sensor line is compressive (i.e. compressible or extensible) relative to the first dielectric, wherein the second dielectric has a lower permittivity than the first dielectric.

In the event of movements of the sensor line, (at least) the second dielectric is compressed or extended due to the movement. In a compression or extension of both dielectrics, the second dielectric is compressed or extended more strongly compared with the first dielectric. The total permittivity, which is composed of the permittivities of the dielectrics, changes thereby. The change in the total permittivity causes a change in the capacitance of the capacitor or capacitors, which change can be measured. Conclusions can be drawn due to this about the mechanical influences on the sensor line. The greater the differences are in the relative permittivities of the dielectrics, the greater is the measurable effect.

Figure 1A:
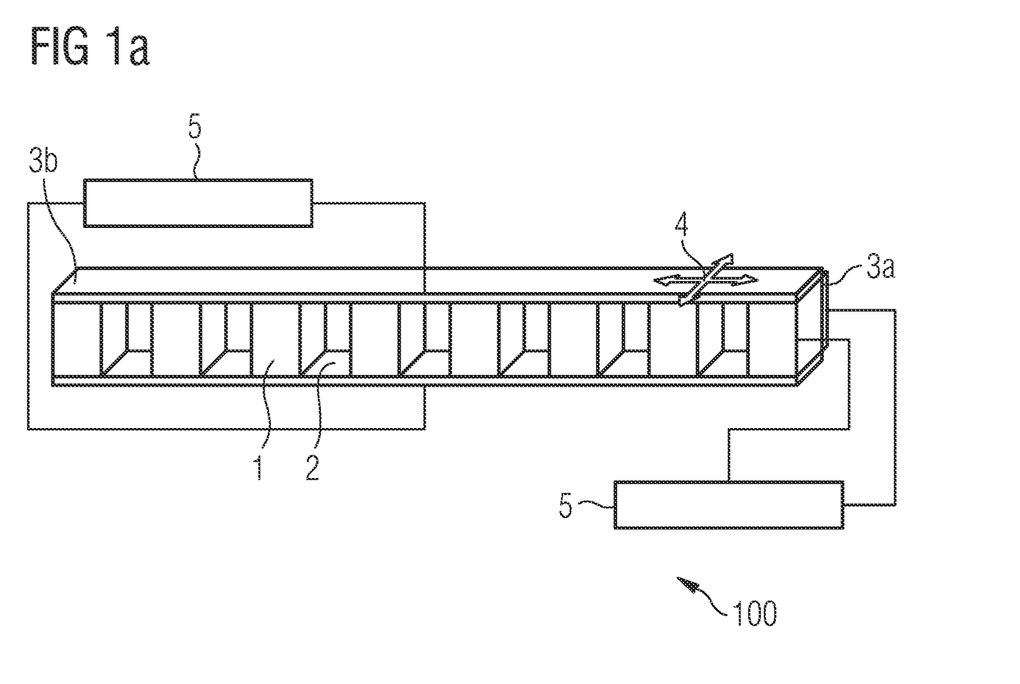
FIGS. 1a to c show a sensor line schematically according to a configuration of the invention described herein.
Figure 1B:
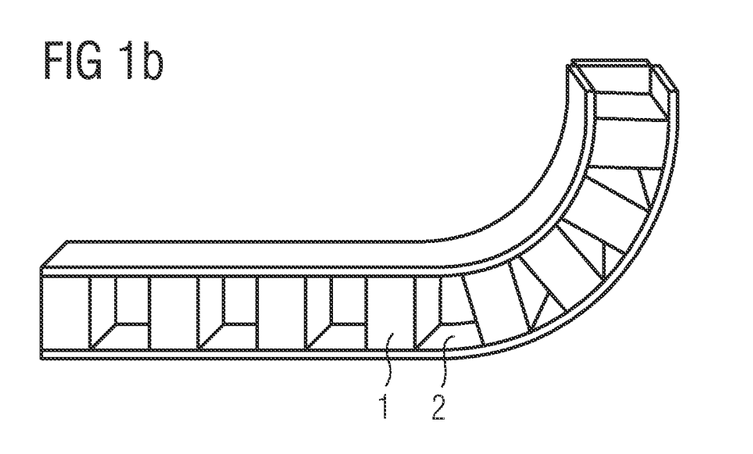
Figure 1C:
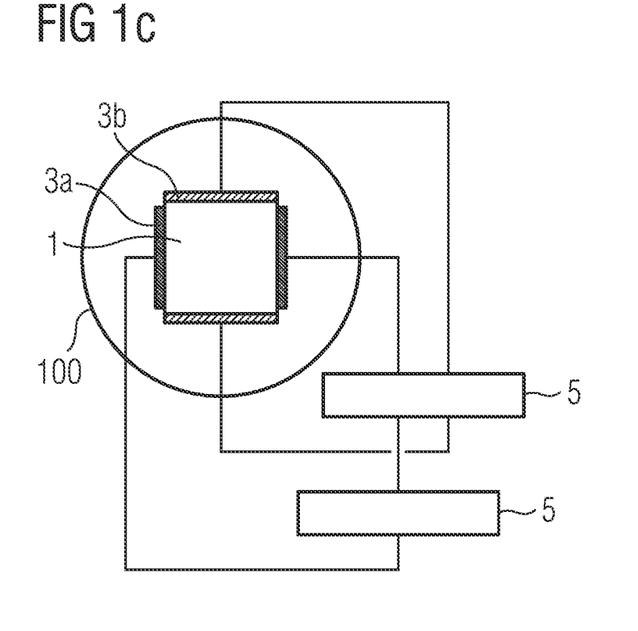

FIGS. 1a to c show schematically a sensor line 100 according to one configuration of the invention described herein.

In the example of FIG. 1a, the dielectric 1 is relatively rigid compared with dielectric 2. Furthermore, in this example the dielectric 1 has a high relative permittivity compared with dielectric 2. The dielectric 2, which is compressive (or more compressive) compared with dielectric 1 and has a lower relative permittivity, comprises air in this example.

The sensor line 100 in this example comprises the capacitors 3a (electrodes arranged top and bottom in the figure) and 3b (electrodes arranged front and back in the figure). The capacitors 3a and 3b, which are arranged here perpendicular to one another, make it possible to determine the direction of a bend (or torsion), in that the capacitances of the capacitors or their changes are compared with one another. The capacitance measurements can be carried out with the help of the apparatuses 5.

The arrows 4 indicate a change in area due to a temperature influence. The change in area has an influence on the capacitance of the capacitors 3a and 3b, which can be measured by the apparatuses 5.

Temperature effects can thus be measured by configurations of the sensor line. The area extension of the capacitor electrodes can be used in this case or a temperature-sensitive dielectric (or temperature-sensitive dielectrics) is/are used. Both cause a change in the measured capacitance.

The capacitance of one of the capacitors is determined here according to:

$$C = \varepsilon_0 \times \varepsilon_r \times A/d,$$

where C is the capacitance of the capacitor, $\varepsilon_0$ is the electric field constant, $\varepsilon_r$ the relative permittivity, A the effective electrode area of the capacitor and d the electrode spacing.

$\varepsilon_0$ and d are constants in this case. A mechanical influence, which can be caused by a bend, a torsion, a lengthening and/or a squashing (i.e. compression), affects the relative permittivity. A temperature influence can affect the effective electrode area and the relative permittivity.

As explained above, the change in the capacitance via the temperature influence usually takes place much more slowly than the change due to mechanical influences. The two influences can be separated from one another by suitable filtering, i.e. the slow offset behaviour of the temperature is separated from fast influences of the mechanics.

As shown in FIG. 1b, in this example the rigid dielectric remains (at least substantially) unchanged in its shape in the event of a bend in the sensor line. On the other hand, the dielectric 2 changes in this example in the event of a bend in such a way that its volume becomes smaller. This leads to a change in the permittivity and thus the measured capacitance.

FIG. 1c shows among other things a schematic cross section of the sensor line 100. Due to the capacitance measurements by means of the apparatuses 5 a comparison can be made of the changes in capacitance, through which the bending direction can be determined.

Figure 2A:
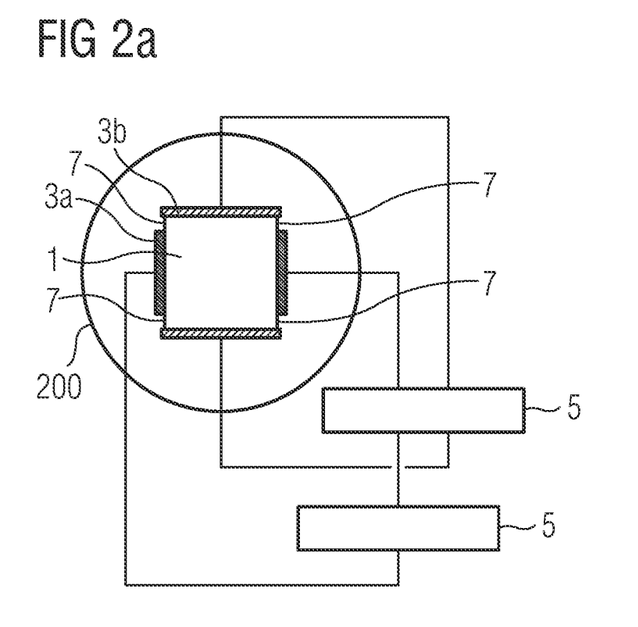
FIGS. 2a and b show a sensor line schematically according to another configuration of the invention described herein.

FIG. 2a shows a structure in which the sensor line 200 has gaps 7 for a medium intrusion. The medium intrusion is represented schematically in FIG. 2b by the arrow 8.

Figure 2B:
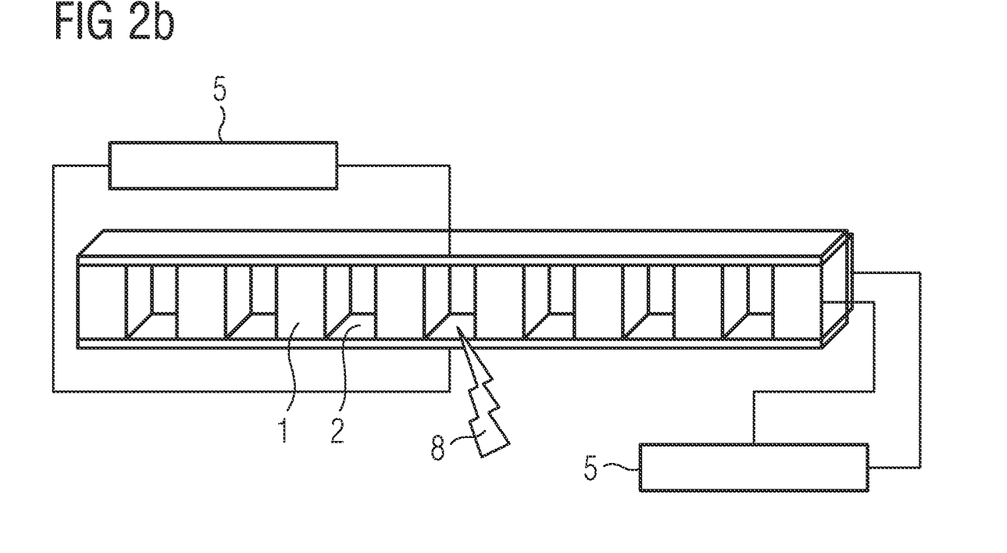

The medium intrusion through the gaps 7 causes the relative permittivity of the dielectric to change in a region in which the medium intrudes. This change can be determined in turn via the change in the capacitance.

A dielectric can comprise a gas (for example, air) or gas mixture in this case, i.e. the sensor line consists of hollow chambers and the capacitors are configured so that a medium can penetrate from outside into these hollow chambers. The total permittivity changes due to the penetration of the medium.

Figure 3A:
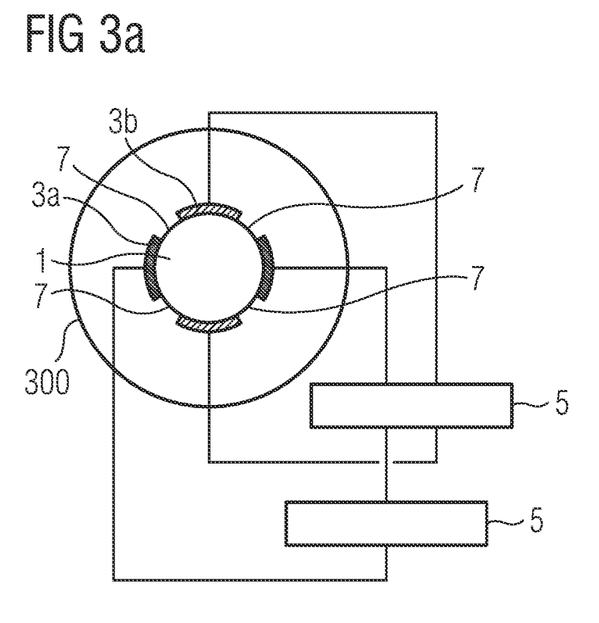
FIGS. 3a and b show a sensor line schematically according to another configuration of the invention described herein.
Figure 3B:
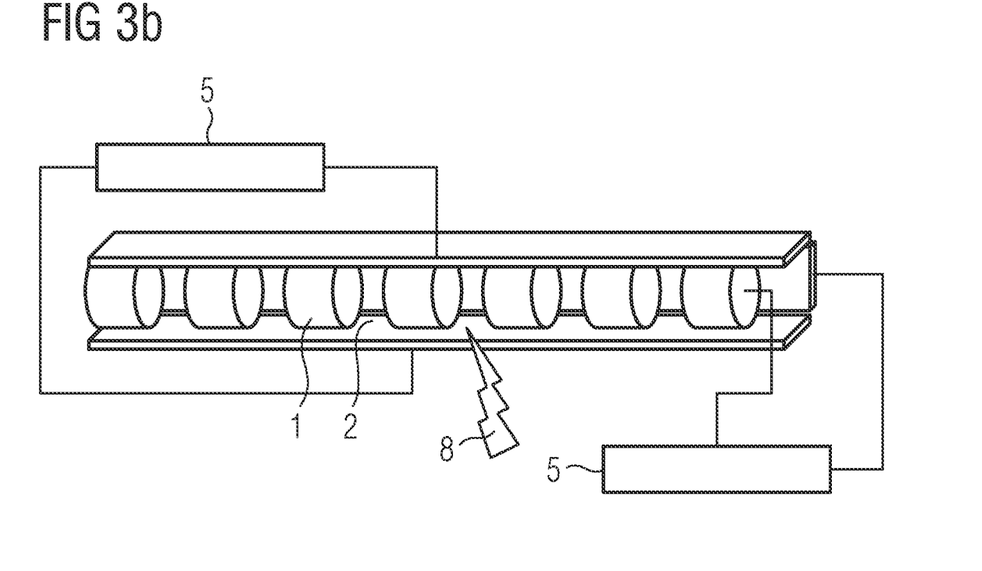

The sensor line 300, which is illustrated in FIGS. 3a and b, differs from the sensor line 200 in FIGS. 2a and b in that the dielectrics and the capacitors 3a and 3b assume round configurations in the sensor line 300. The dielectric 2 (see FIG. 3b) consists in this example of air (i.e. hollow chambers), so that these can be filled by a medium.

Figure 4:
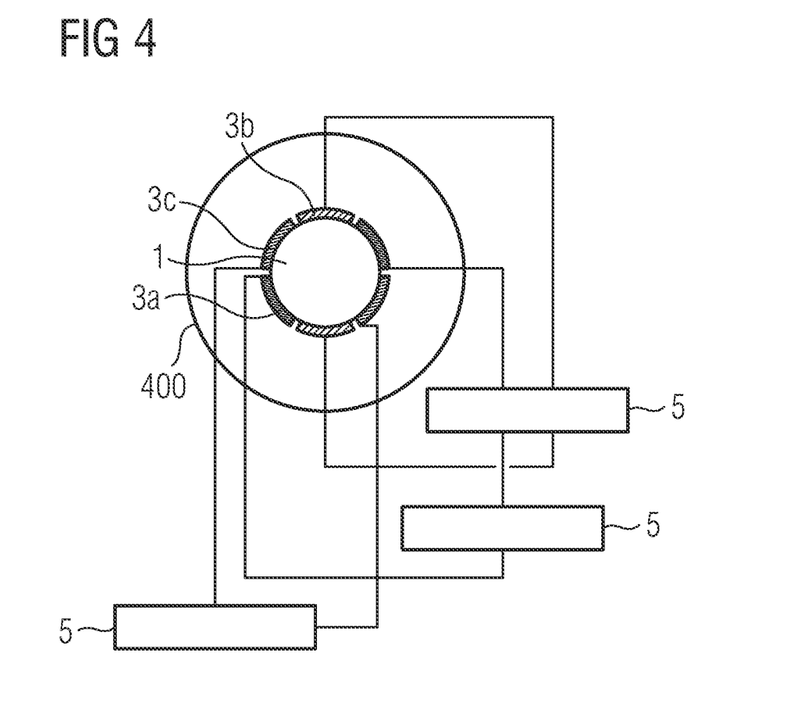
FIG. 4 shows a sensor line schematically according to another configuration of the invention described herein.

FIG. 4 shows among other things a sensor line 400, in which three capacitors 3a, 3b and 3c are used. A bend or a torsion of the sensor line or of the cable can be determined even more accurately due to the three capacitance measurements by means of the apparatuses 5.

Figure 5A:
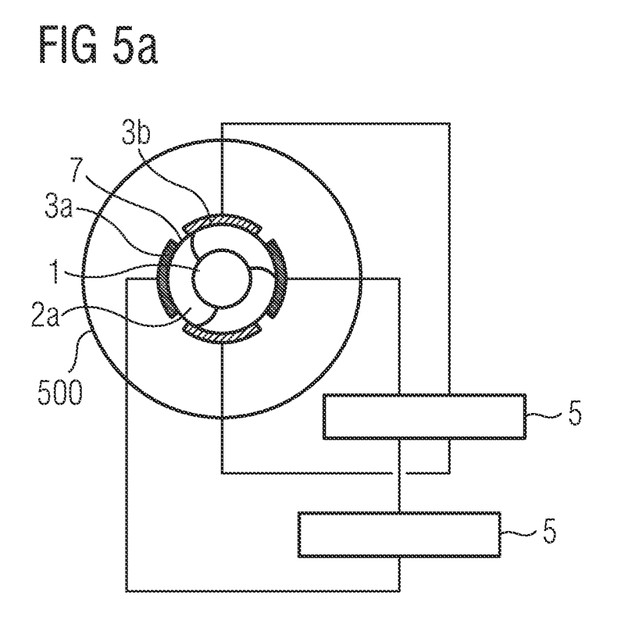
FIGS. 5a and b show a sensor line schematically according to another configuration of the invention described herein.
Figure 5B:
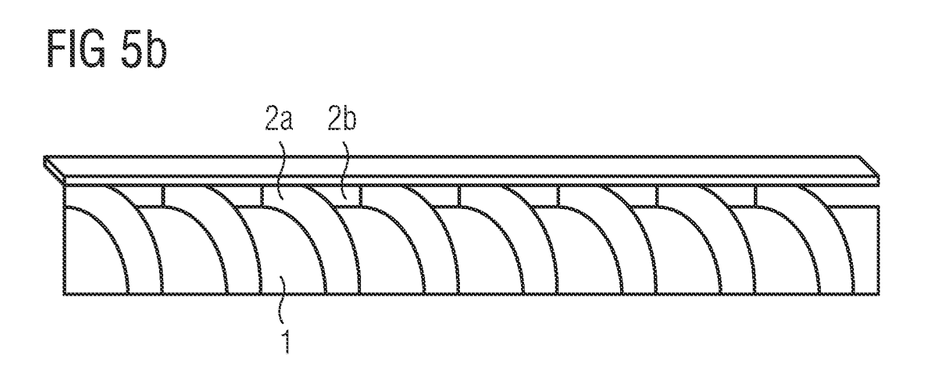

FIGS. 5a and b show schematically a sensor line 500 among other things, in which line a (relative to the dielectrics 2a and 2b) rigid dielectric 1, a (relative to the dielectric 1) flexible (i.e. compressive) dielectric 2a with a (relative to dielectric 2b) high relative permittivity and a compressive dielectric 2b with a low relative permittivity are used. In this example the dielectric 2b comprises air.

The spiral winding of the dielectric 2a around the dielectric 1 permits a relatively simple design of the sensor line 500 with the advantages described herein of the invention presented.

Any configurations of the sensor line that are described herein can be fitted in the interior of a cable. On the other hand, the cable as a whole can serve at the same time as a sensor line, i.e. a separate sensor line is thus dispensable.

Figure 6A:
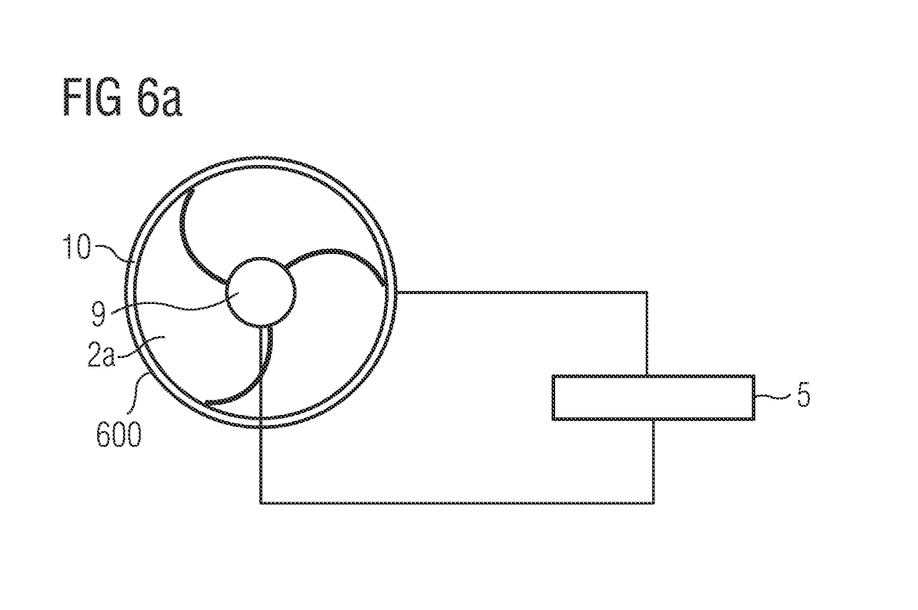
FIGS. 6a and b show a coaxial cable schematically according to a configuration of the invention described herein.
Figure 6B:
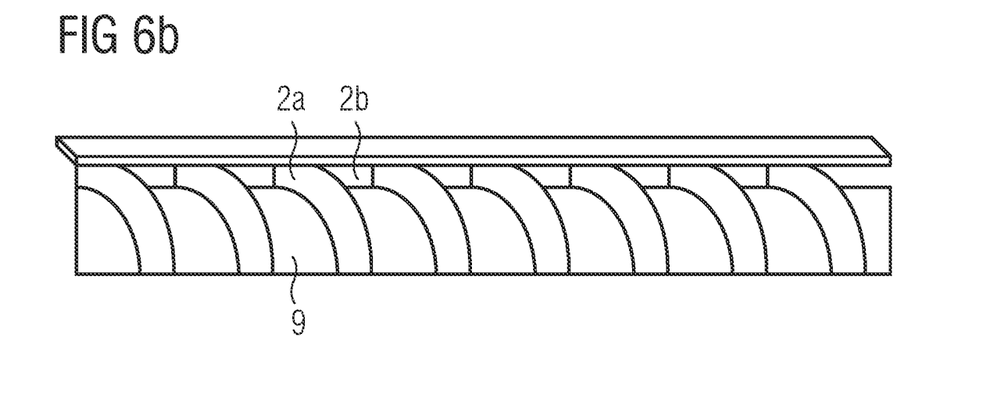

FIGS. 6a and b show among other things a sensor line 600, which is used as a coaxial cable. In this case the sensor line 600 comprises an outer conductor 10 (electrode), an inner conductor 9 (electrode) and, as shown in FIG. 6a, a flexible dielectric 2a.

As is to be seen in FIG. 6b, the sensor line 600 comprises a flexible dielectric 2a with a (relative to the dielectric 2b) high relative permittivity and a compressive dielectric 2b with a (relative to the dielectric 2a) low relative permittivity. In this example the dielectric 2b comprises air.

The structure shown in FIGS. 6a and b thus makes it possible to detect external influences on the coaxial cable.

As explained above, mechanical influences in particular can be measured more accurately by the configurations described herein of the sensor line and the method for detecting a mechanical influence or temperature influence on a cable or a medium intrusion into a cable, as these influences strongly affect the measured capacitance.

Furthermore, mechanical influences can be separated from temperature influences.

When using two capacitors the direction of a bend and/or the rotation direction of a torsion can also be determined.

The method is based on the measurement of the change in capacitance of the line. Small capacitance changes can be measured by a broad spectrum of methods. These are, for example, the phase displacement in the case of a standing wave or the change in time of the charging/discharging behaviour for a square-wave voltage. The expert is familiar with these and other measuring methods.

The broad spectrum makes it possible to select a low-cost measuring approach for the sensor line and thus to manufacture this line cheaply.

In conclusion it should be pointed out in particular that the exemplary embodiments mentioned above serve only to describe the claimed teaching, but do not restrict this to the exemplary embodiments.

The invention claimed is:

1. A sensor line for detecting an external influence on a cable, wherein the sensor line comprises:
   a capacitor, a first dielectric, which has a first compressibility and a first permittivity, and a second dielectric, which has a second compressibility and a second permittivity, wherein the first compressibility is smaller than the second compressibility, wherein the first permittivity differs from the second permittivity, wherein the sensor line is configured so that at least the second dielectric is compressible or extensible in the event of a movement of the sensor line, so that a total permittivity, which is composed of the first permittivity and the second permittivity, is variable in the movement of the sensor line, wherein due to the change in the total permittivity a change in the capacitance of the capacitor can be produced, which is detectable, in order to detect the external influence on the cable, wherein at least one of the dielectrics comprises a temperature-sensitive dielectric, wherein the sensor line is further configured to detect an external temperature influence on the sensor line by means of the temperature-sensitive dielectric, and wherein one of the first and second dielectrics has a positive temperature coefficient and the other of the first and second dielectrics has a negative temperature coefficient.

2. The sensor line according to claim 1, wherein the first permittivity differs from the second permittivity by a factor of at least five.

3. The sensor line according to claim 1, wherein the sensor line comprises a plurality of capacitors, and wherein the sensor line is configured so that a direction of a bend and/or a rotation direction of a torsion of the sensor line are detectable by a comparison of changes in the capacitances of the capacitors due to the movement of the sensor line.

4. The sensor line according to claim 1, wherein the second dielectric comprises a gas or a gas mixture.

5. The sensor line according to claim 4, wherein the sensor line is configured so that the total permittivity is variable due to a penetration of a medium into at least a part of a volume, which is taken up by the gas or the gas mixture.

6. The sensor line according to claim 1, wherein the sensor line is further configured to detect an external temperature influence on the sensor line by means of an area extension of an electrode of the capacitor.

7. The sensor line according to claim 1, wherein the second dielectric is wound around the first dielectric, in particular spirally.

8. The sensor line according to claim 1, formed as a coaxial cable, wherein capacitor electrodes form an inner conductor and an outer conductor of the coaxial cable.

9. The sensor line according to claim 1, wherein the first permittivity differs from the second permittivity by a factor of at least ten.

10. The sensor line according to claim 1, wherein the first permittivity differs from the second permittivity by a factor of at least twenty.

11. The sensor line according to claim 1, wherein the dielectrics are fitted alternating along a longitudinal direction of the sensor line in an interior of the sensor line.

12. A line, comprising:
a sensor line comprising:
a capacitor,
a first dielectric, which has a first compressibility and a first permittivity, and
a second dielectric, which has a second compressibility and a second permittivity,
wherein the first compressibility is smaller than the second compressibility,
wherein the first permittivity differs from the second permittivity,
wherein the sensor line is configured so that at least the second dielectric is compressible or extensible in the event of a movement of the sensor line, so that a total permittivity, which is composed of the first permittivity and the second permittivity, is variable in the movement of the sensor line, wherein due to the change in the total permittivity a change in the capacitance of the capacitor can be produced, which is detectable, in order to detect the external influence on the cable, and wherein the dielectrics are fitted alternating along a longitudinal direction of the sensor line in an interior of the sensor line;
a Bowden cable, which is fitted in the interior of the line and is fixed in a first region on a first side of the sensor line, and
a protective sheath, which is fixed in a second region on a second side of the sensor line,
wherein the line is configured so that the Bowden cable can be rotated or moved by torsion or bending of the line inside the protective sheath.

13. A system for detecting an external influence on a cable, wherein the system comprises:
a line comprising:
a sensor line comprising:
a capacitor,
a first dielectric, which has a first compressibility and a first permittivity, and
a second dielectric, which has a second compressibility and a second permittivity,
wherein the first compressibility is smaller than the second compressibility,
wherein the first permittivity differs from the second permittivity,
wherein the sensor line is configured so that at least the second dielectric is compressible or extensible in the event of a movement of the sensor line, so that a total permittivity, which is composed of the first permittivity and the second permittivity, is variable in the movement of the sensor line, wherein due to the change in the total permittivity a change in the capacitance of the capacitor can be produced, which is detectable, in order to detect the external influence on the cable, and wherein the dielectrics are fitted alternating along a longitudinal direction of the sensor line in an interior of the sensor line;
a Bowden cable, which is fitted in an interior of the line and is fixed in a first region on a first side of the sensor line, and
a protective sheath, which is fixed in a second region on a second side of the sensor line, wherein the line is configured so that the Bowden cable can be rotated or moved by torsion or bending of the line inside the protective sheath;
and
a filter system, which is configured to detect a type of external influence on the cable on the basis of a temporal change in the capacitance of the capacitor.

14. A method for detecting a mechanical influence or temperature influence on a cable or a medium intrusion into a cable, wherein the method comprises:

provision of one of:
(a) a sensor line comprising:
a capacitor,
a first dielectric, which has a first compressibility and a first permittivity, and
a second dielectric, which has a second compressibility and a second permittivity,
wherein the first compressibility is smaller than the second compressibility,
wherein the first permittivity differs from the second permittivity,
wherein the sensor line is configured so that at least the second dielectric is compressible or extensible in the event of a movement of the sensor line, so that a total permittivity, which is composed of the first permittivity and the second permittivity, is variable in the movement of the sensor line, wherein due to the change in the total permittivity a change in the capacitance of the capacitor can be produced, which is detectable, in order to detect the external influence on the cable, and wherein the dielectrics are fitted alternating along a longitudinal direction of the sensor line in an interior of the sensor line;
(b) a line comprising:
the sensor line,
a Bowden cable, which is fitted in an interior of the line and is fixed in a first region on a first side of the sensor line, and
a protective sheath, which is fixed in a second region on a second side of the sensor line, wherein the line is configured so that the Bowden cable can be rotated or moved by torsion or bending of the line inside the protective sheath;
(c) a system comprising the sensor line and a filter system which is configured to detect a type of external influence on the cable on the basis of a temporal change in the capacitance of the capacitor; or
(d) a system comprising the line and a filter system which is configured to detect a type of external influence on the cable on the basis of a temporal change in the capacitance of the capacitor; and
measurement of a change in a capacitance of a capacitor for detection of the mechanical influence or temperature influence on the cable or the medium intrusion into the cable.

15. The method according to claim 14, wherein the sensor line comprises a plurality of capacitors, further comprising comparison of changes in the capacitances of the capacitors due to a movement of the cable, and determination of a direction of a bend and/or a rotation direction of a torsion of the cable on the basis of the comparison.

* * * * *